United States Patent [19]

Fielden et al.

[11] Patent Number: 4,459,541

[45] Date of Patent: Jul. 10, 1984

[54] CIRCUIT FOR MEASURING CAPACITANCE

[75] Inventors: John E. Fielden, Glyn Garth; Robert G. Lloyd, Bangor, both of Wales

[73] Assignee: A. G. Mestra, Reinach, Switzerland

[21] Appl. No.: 317,273

[22] Filed: Nov. 2, 1981

[30] Foreign Application Priority Data

Nov. 7, 1980 [GB] United Kingdom ............... 8035807

[51] Int. Cl.³ .................... G01R 11/52; G01R 27/26
[52] U.S. Cl. ............................................. 324/60 CD
[58] Field of Search ........................ 324/60 CD, 60 C

[56] References Cited

U.S. PATENT DOCUMENTS

Re. 27,829 12/1973 Tiffany ..................... 324/60 C X
3,165,694 1/1965 Young .................... 324/60 CD UX
3,886,447 5/1975 Tanaka ..................... 324/60 CD
4,339,750 7/1982 Delacruz ................. 324/60 CD X

FOREIGN PATENT DOCUMENTS 939660 10/1963 United Kingdom .
1575167 9/1980 United Kingdom .

Primary Examiner—Stanley T. Krawczewicz
Attorney, Agent, or Firm—Pravel, Gambrell, Hewitt, Kirk & Kimball

[57] ABSTRACT

A circuit and method for measuring the capacitance of a circuit element. A reference capacitor, a voltage source, and a switching circuit are arranged such that the circuit element and the reference capacitor are alternately charged and discharged from the voltage source at the same frequency, the charging of the circuit element being synchronized with either the charging or the discharging of the reference capacitor. Currents of the circuit element and the reference capacitor, for example the discharge currents, are supplied to a reservoir capacitor circuit and compared to provide a measure of the difference between the capacitances of the circuit element and the reference capacitor. The comparison is made by monitoring the feedback current necessary to maintain the charge of the reservoir capacitor circuit substantially constant.

8 Claims, 3 Drawing Figures

CIRCUIT FOR MEASURING CAPACITANCE

The present invention relates to a circuit for measuring capacitance.

A circuit for measuring capacitance is known which comprises a pair of transistors driven by a stable frequency oscillator. The circuit operates so that the transistors are turned on alternately, one transistor being arranged to charge the capacitance being measured to a known voltage, the other being arranged to discharge the capacitance to zero voltage. The discharge current is monitored to provide a measure of the capacitance.

In the known circuit the frequency of the charge/discharge sequence is selected in dependence upon the sensitivity required and the capability of the transistors to fully charge and discharge the capacitance being measured. The discharge current is smoothed using a large storage capacitor and the resultant smoothed current is compared with a predetermined reference current supplied from a stabilized current source. Any difference between the currents is amplified to provide an output capable of driving for example a relay.

The known circuit is based on the equation:

$$I = CVf$$

where
I is the discharge current
C is the capacitance
V is the supply voltage
f is the frequency of the charge/discharge cycle.

An accurate measurement of capacitance can only be obtained by monitoring the current if the voltage and frequency are maintained constant. A change in voltage can be compensated for by making the reference current voltage dependent. It is however difficult to achieve frequency compensation and therefore a stable frequency source is required. Stable frequency sources such as crystal oscillators are of course available but they are expensive and therefore in many applications cannot be used. It is an object of the present invention to provide an accurate and economical device for measuring capacitance.

According to the present invention, there is provided a circuit for measuring the capacitance of a circuit element, comprising a reference capacitor, a switching circuit for alternately charging and discharging the circuit element and the reference capacitor at the same frequency, the charging of the circuit element being synchronised with either the charging or the discharging of the reference capacitor, and means for comparing currents of the circuit element and the reference capacitor to provide a measure of the difference between the capacitances of the circuit element and the reference capacitor, characterised in that the circuit element and the reference capacitor are charged from a common voltage source, and the comparing means comprises a reservoir capacitor circuit connected so as to receive said currents, feedback circuit means for maintaining the charge stored by said reservoir capacitor circuit substantially constant, and means for monitoring the operation of the feedback circuit means to provide said measurement.

The use of a reference capacitor and the making of a comparison of currents makes the discrimination of their capacitances independent of the stability of the supply voltage and of the operating frequency of the switching circuit. If the circuit is set up so that the compared currents are initially identical, only a subsequent change in capacitance can cause the compared currents to go out of balance. The accuracy of the measurement relies upon static components only and is therefore infinitely stable.

The circuit is responsive to the difference between the two capacitances, not to the ratio of their magnitudes, and variations in the supply voltage and frequency only affect the difference, not the standing capacitance of the reference capacitor. Thus an increase in capacitance which is small in percentage terms can be readily resolved. Furthermore the required incremental measurement can be made using any value of reference capacitance within the chosen operational range of the circuit.

Preferably the switching circuit comprises two solid state switches controlled by the output of an oscillator.

In one arrangement, one switch is connected in series with the circuit element across the supply, and the other switch is arranged in series with the reference capacitor across the supply. The switches are controlled to simultaneously charge up their respective capacitors, and then to discharge them into respective larger reservoir capacitors. The discharge currents are compared by comparing feedback currents required to maintain the voltage across the reservoir capacitors constant.

In another arrangement, the two switches are arranged in series across the supply and are controlled to charge up one capacitance to the supply voltage and to charge up the other to a fixed voltage proportional to the supply voltage. The said one capacitance is then discharged to the said fixed voltage, and the other capacitance is fully discharged. A larger reservoir capacitor is arranged to be charged up by one discharge current and discharged by the other. The current required to maintain constant the voltage across the reservoir capacitor is monitored to provide a measure of the difference between the two discharge currents and therefore of the two capacitances being compared.

In each of the above arrangements the switching frequency is such that the circuit element and the reference capacitor are fully charged and then fully discharged in the course of each switching cycle.

The invention also provides a method for measuring the capacitance of a circuit element, wherein the circuit element and a reference capacitor are alternately charged and discharged at the same frequency, the charging of the circuit element being synchronised with either the charging or the discharging of the reference capacitor, and currents of the circuit element and the reference capacitor are compared to provide a measure of the difference between the capacitances of the circuit element and the reference capacitor, characterised in that the circuit element and the reference capacitor are charged from a common voltage source, the said currents are supplied to a reservoir capacitor circuit, the charge stored by said reservoir capacitor circuit is maintained substantially constant by a feedback circuit means, and the operation of the feedback circuit means is monitored to provide said measurement.

Embodiments of the present invention will now be described, by way of example, with reference to the accompanying drawings, in which.

Figure 1:
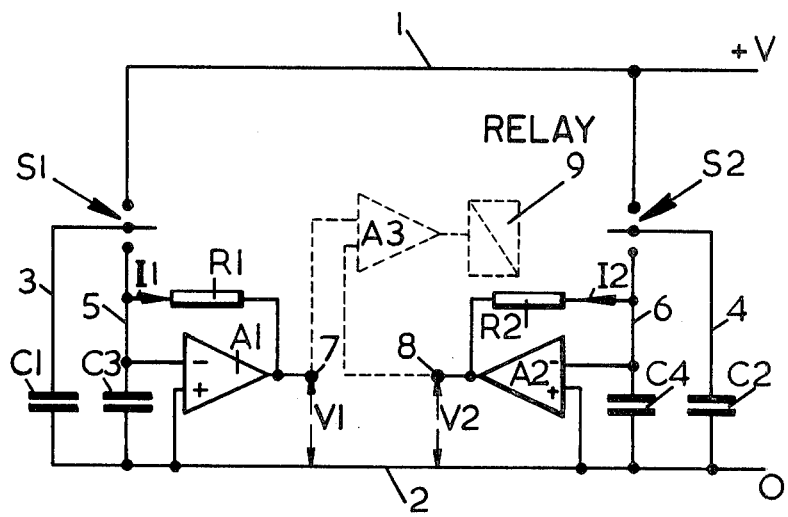
FIG. 1 is a circuit diagram of a first embodiment of the invention.

With reference to FIG. 1 line 1 is maintained at a constant D.C. voltage of +V with respect to gound line 2. Connected in parallel between lines 1 and 2 are changeover switches S1 and S2 operated in synchronism by the output of an oscillator (shown schematically by dotted lines) alternately to connect line 1 to lines 3 and 4 and lines 3 and 4 to lines 5 and 6 respectively. In the first condition capacitors C1 and C2 are connected across the supply and in the second condition capacitors C1 and C2 are connected across capacitors C3 and C4 respectively. Capacitors C3 and C4 are of substantially equal capacitance, being several times larger than capacitors C1 and C2.

The capacitor C1 represents the circuit element the capacitance of which is to be measured, whereas C2 is a reference capacitor. Capacitors C1 and C2 are of substantially the same capacitance.

The non-inverting input terminals of similar operational amplifiers A1 and A2 are connected to ground line 2. The inverting input terminals of amplifiers A1 and A2 are connected to lines 5 and 6 respectively. The outputs of the amplifiers A1 and A2 are connected to output terminals 7, 8 respectively and via feed-back resistances R1 and R2 to the lines 5 and 6.

Switches S1, S2 operate to simultaneously connect capacitors C1, C2 to line 1 for a time sufficient to allow both capacitors to charge to voltage +V. Then the switches change over simultaneously to connect capacitor C1 to C3 and capacitor C2 to C4. The capacitors C1 and C2 discharge into capacitors C3 and C4 for a time sufficient to allow full discharge. Then switches S1 and S2 change back and capacitors C1 and C2 are charged again. This cycle is repeated continuously.

The amplifiers A1 and A2 maintain currents I1 and I2 through resistances R1 and R2 respectively which currents are sufficient to maintain the voltages across capacitors C3, C4 substantially zero. These currents I1 and I2 are equal to and are in fact the currents discharged from the capacitors C1 and C2 and accordingly the voltage outputs V1 and V2 appearing at terminals 7 and 8 are respectively $I1 \times R1$ and $I2 \times R2$. Thus the output voltages V1 and V2 are exactly proportional to the capacitance of capacitors C1 and C2 respectively since the voltage +V and the frequency of the switch operation are the same for both parts of the circuit. C3 and C4 have the same capacitance, and R1 and R2 have the same resistance. Thus any difference between the voltages V1 and V2 is a measure of the difference between the capacitances of capacitors C1 and C2.

When the capacitances of C1 and C2 are equal then V1=V2. If the capacitance of C1 changes, the change can be measured by observing the value of V1 and comparing it with V2. For example this comparison may be made by connecting outputs to the inputs of an operational amplifier A3 which then gives an output signal which is a function of the change in the capacitance of C1. This output signal from A3 may be supplied to for example a relay 9 set to operate when the output from A3 corresponds to a predetermined change in C1 which it is desired to detect. The point at which the relay 9 operates has high stability and the sensitivity of the system will be the same for any value of C1, C2. For example if the gain of the operational amplifier A3 is such that relay 9 is to operate when C1 exceeds C2 by, for example 0.1 pF, the relay will switch on this difference being attained if, for example, C2 is 10 pF and C1 was initially 10 pF or if C2 is 500 pF and C1 was initially 500 pF.

Figure 2:
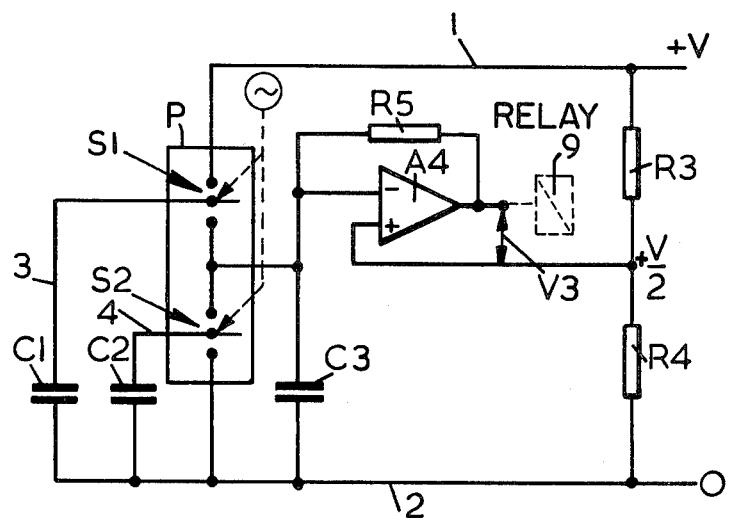
FIG. 2 is a circuit diagram of a second embodiment of the invention.

A second embodiment of the system is shown in FIG. 2. Elements corresponding to elements of FIG. 1 carry the same references. Switches S1 and S2 are in series between lines 1 and 2. When switch S1 connects line 3 to line 1, switch S2 connects capacitor C2 via line 4 to C3. When switch S1 connects capacitor C1 to capacitor C3, switch S2 shorts out capacitor C2. In the first condition capacitor C1 is charged up to +V and capacitor C2 is charged up to the voltage across capacitor C3, whereas in the second condition capacitor C1 discharges into capacitor C3 and capacitor C2 is fully discharged.

The capacitor C3 is connected to the inverting input of an operational amplifier A4 the other input of which receives a voltage of +V/2 provided by a divider comprising equal resistances R3, R4. A feedback resistor R5 enables the amplifier A4 to supply feedback current to maintain the voltage across capacitor C3 constant and equal to +V/2.

During the course of each switching cycle, capacitor C1 is initially charged to +V, and capacitor C2 is simultaneously charged to V/2. Switches S1 and S2 then change over and capacitor C1 discharges down to V/2 and C2 discharges down to ground. If the capacitors C1 and C2 have the same capacitance, the energy discharged by one will be equal to that discharged by the other, and the charge on C3 will be unaltered. The voltage across capacitor C3 will thus stay at +V/2, no current will flow through feedback resistor R5, and the output of amplifier A3 will remain at +V/2.

If C1 is greater than C2, C3 will be charged with more energy than is discharged via C2. The amplifier A4 responds to maintain the voltage across C3 at +V/2 by negative feedback, the output voltage of amplifier A4 falling so that a voltage difference V3 appears between that output and the +V/2 input.

Should C2 be greater than C1, then C3 will be charged with less energy by C1 than is discharged via C2 and the output voltage of amplifier A4 rises to produce positive feedback.

The output voltage V3 is a function of the discharge currents from C1 and C2 and is thus a measure of the difference in capacitance between C1 and C2.

If one wishes to detect when the value of C1 changes, C2 being fixed and C1 and C2 being initially of equal capacitance then the output voltage V3 corresponding to the change may be used to operate for example a relay 9, to indicate the change has occurred.

The circuit of FIG. 2 is more economical than that of FIG. 1 as it requires only one amplifier. This is because in FIG. 2 the discharge currents are compared prior to amplification, whereas in FIG. 1 the comparison is made after amplification.

In the above-described embodiments the stability of the circuit when C1 equals C2 is dependent upon the stability of resistors R1, R2 (FIG. 1) and R3, R4 (FIG. 2). If these resistors have the same temperature coefficients then the circuits will be completely stable.

Preferably both switches S1 and S2 are CMOS devices on the same silicon chip P (FIG. 2). Both switches are driven by the same frequency source, and in such a manner that they break before make to eliminate current leakage during switching transients. Using such switches there should be no static leakage, but if there is a small leakage it cancels out in the balanced system and should track at all temperatures.

As indicated above, when C1 is equal to C2 variations in the supply voltage or the switching frequency are of no consequence. When it is desired to measure the magnitude of a difference between C1 and C2, the relationship between the output and the magnitude of the difference is dependent upon voltage and frequency but these two parameters can be easily controlled to provide a stability that will allow a three and a half digit readout (1 part in 2000). For example, an inexpensive ceramic resonator provides adequate frequency stability for the devices described.

The frequency of switching is such that time is allowed for each capacitor to fully charge and fully discharge during each switching cycle which alternately charges and discharges the two capacitors from the same voltage and at the same frequency. This ensures that each of the two currents discharged from the two capacitors has a perfectly linear relationship to the capacitance of the respective capacitor.

As all measurements are made relative to ground, i.e. the plate of the measuring capacitor is grounded, it may be necessary in certain applications to prevent any possible leakage to ground in order that the high accuracy of the system is maintained.

Therefore in applications where there may be leakage on the insulation that supports the 'live' plate of the capacitor a 'Faraday' screen may be used to eliminate all possible leakage due to condensation or other contamination. This may consist of an additional electrode of appropriate shape placed on the surface of the insulator so that it isolates the measuring electrodes from ground, the electrode being energised by a voltage equal in magnitude and phase with the voltage present on the measuring electrode and the guard ring so there is no current present on the surface of the insulator and hence no errors in measurement. Current may now flow from the guard ring to ground but the source of this current is completely separate from the measuring circuit.

As described above, the illustrated circuits make it possible to measure a difference in capacitance to an order of accuracy which has not previously been available. For example, if it is required to measure an increment of say 5 pF in a capacitance of say 500 pF, a conventional accurate precision bridge may be used which on the 10,000 pF scale has a resolution of 0.1% or 0.01% so that one may discriminate 10 pF in the first case or 1 pF in the second. A bridge is only capable of resolving the increment in the total scale, and provides a ratio measurement.

The described embodiments of the present invention are linear divices, not ratio devices. The linear device subtracts 4995 pF and measures the remaining 5 pF to say four figure accuracy. It is thus possible to discriminate to say 0.001 pF. As previously explained the 4995 pF subtraction is infinitely stable. Only the 5 pF increment is subject to the need for stable voltage and frequency and these can be stabilised to acceptable accuracy.

Where the circuit is used as a measuring instrument, dependence on frequency increases the flexibility of the device, and allows accurate calibration in the low values of capacitance from known standards of higher values.

The fundamental frequency of the device may be fixed by a quartz crystal or a ceramic resonator and the frequency can be switched to any sub-multiple of the fundamental. Thus, if the device is scaled to read full scale at say 5000 pF with the switches operated at frequency F then at F×10 it would give full scale at 500 pF and at F×100 full scale at 50 pF. The current flowing from the discharge of both capacitors is exactly proportional to the number of times they are charged and discharged.

The circuits described above may be used in capacitance arrangements for measuring the level attained by a liquid or granular material. For example a pair of spaced plates or rods may form a horizontal probe at a height which it is desired to know the liquid or granular material has attained. The capacitance of the probe changes when it is touched by material of a different di-electric constant to air. The probe and a connecting co-axial cable provide the capacitance C1 which is to be monitored and a fixed capacitor and/or a duplicate cable provides the reference capacitance C2. The incremental change will be the change in capacitance of C1 due to the material touching the probe and this increment can cause operation of a relay 9.

If the probe is arranged substantially vertically in a container the capacitance C1 will linearly increase as the material in the container rises up the probe. The capacitance of the probe and connecting cable when the material is at the lowest level in the container is balanced by C2 which is a fixed capacitor and/or duplicate cable. The increment is now the difference between C1 and C2 which is produced by the material rising from the bottom level where C1=C2 to the top level where C1 is greater that C2.

The system may be used in the measurement of a variable physical characteristic, for example, pressure, strain, weight or relative position in which a change in the characteristic causes a proportionate relative movement of one plate of a condenser relative to its other plate which may be fixed. The capacitance of C2 will be arranged to be the same as C1 when the condenser plates are in an initial position. C2 may be a fixed capacitor but in preference it will be a complete duplication of the structure of C1 so that any effects of environmental changes are cancelled out. The increment to be measured is now the changing capacitance due to the changing position of one condenser plate in relation to the other condenser plate.

The system may also be used to compare the di-electric constants of two substances. In such an arrangement the capacitance C1 comprises a first condenser and capacitance C2 comprises a second condenser of substantially identical structure. When only air is between the plates of the condensers the capacitance of C1 equals the capacitance of C2. Substances may then be placed between the plates of the respective condensers, for example by immersing the condensers in the substances, any resultant difference observed between C1 and C2 being a function of the difference in di-electric constants of the substances. This may be used in the testing of purity or in quality control of substances. The reference substance of the desired purity or quality is disposed between the plates of the second condenser, and a sample of the substance whose purity or quality is being inspected is disposed between the plates of the first condenser. If the two substances are of equal purity or quality their di-electric constants will be equal and C1 will equal C2, but not otherwise. For example the technique may be used to determine if aviation fuel has been contaminated, for example, by water, the second consenser being submerged in a sample of the pure fuel.

The circuit of FIG. 1 or 2 can be used in a measuring instrument for test or laboratory use. Initially long coaxial cables are connected to terminals of the instrument to constitute capacitances C1 and C2 which are made equal by using appropriate lengths of cable. Then a capacitance which it is desired to measure is connected in parallel with C1 and the resulting increase in capacitance is measured.

Figure 3:
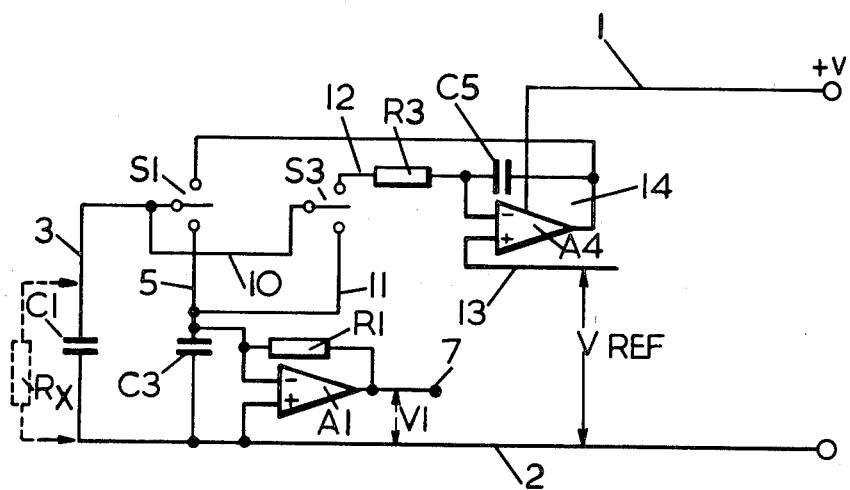
FIG. 3 is a circuit diagram illustrating a modification to the circuit of FIG. 1.

Referring now to FIG. 3, a modification to the circuit of FIG. 1 will be described. The embodiment of FIG. 3 involves additions to the basic circuit of FIG. 1 to satisfy certain applications. In the measurement of the dielectric constant of certain liquids (or solids) it is desirable to be able to separate any error due to a resistive component which may be due to circuit leakage or to any slight conductivity in the substance under examination.

The circuit of FIG. 1 is particularly suitable to satisfy this requirement. The capacitor C1 under examination is switched to a fixed voltage source and fully charged to that voltage. It is therefore maintained at this voltage from the source independent of any leakage resistance indicated schematically in FIG. 3 by reference Rx. It is then switched from the source to the reservoir capacitor C3 and the resulting feedback current is equal to the energy stored in the capacitor C1.

However in practice the switch is a solid state device which does not change from zero resistance to infinite resistance; it in fact changes from a few hundred ohms to serveral megohms. In consequence if there is any current flow due to leakage resistance Rx, then there will be a small potential drop across the switch when closed. The capacitor C1 is thus charged to a potential less than the fixed voltage required.

The circuit of FIG. 3 (which only shows half of a complete circuit as will be appreciated by reference to FIG. 1) has been modified to maintain the charge voltage of the capacitor a constant, by adjusting the voltage applied to the switch. This is achieved by providing two peak rectifiers only one of which is shown in FIG. 3. The peak rectifiers measure the peak charging voltage in the capacitors C1, C2 and are coupled to two operational amplifiers which compare the peak voltages/in either capacitors with a fixed reference voltage. These amplifiers provide the switch voltages and maintain the capacitors charging voltage constant independent of the switch resistance.

For clarity only one half of the full circuit is shown, the second half being identical and also including amplifier A3 and control unit 9 as shown in FIG. 1.

Referring in detail to FIG. 3, references common to FIGS. 1 and 3 identify identical components. A further switch S3 is provided, driven in synchronism with S1, such that when line 3 is connected via switch S1 to line 14, line 3 is also connected via line 10 to line 12 and hence to the inverting input of an amplifier A4 via resistor R3. This configuration of the circuit establishes a voltage on line 3 during the charge period, which is equal to the voltage on line 13, the latter being connected to a fixed reference voltage. Thus whatever the series resistance presented by S1 to the capacitor C1 with a leakage resistance Rx in parallel with it, the amplifier A4 adjusts the voltage on line 14 such that the voltage drop across the resistance component of S1 is compensated, resulting in the voltage to which C1 is charged being equal to the reference voltage on line 13.

The resistance presented by S3 is of little consequence as the input current into A4 via R3 is negligible. Component C5 connected across the amplifier A4 ensures circuit stability and also acts as an integrator capacitor to hold the voltages on lines 12 and 14 very near their normal values when the capacitor C1 is being discharged via lines 3, 5 and S1, together with lines 10, 11 and S3 into capacitor C3 and the measuring amplifier A1.

What is claimed is:

1. A circuit for measuring the capacitance of a circuit element, comprising a reference capacitor, a switching circuit for cyclically charging and discharging the circuit element and the reference capacitor at the same frequency from a common voltage source, the charging of the circuit element being synchronized with either the charging or the discharging of the reference capacitor, and means for comparing currents of the circuit element and the reference capacitor to provide a measurement of the difference between the capacitances of the circuit element and the reference capacitor, wherein the comparing means comprises a reservoir capacitor circuit which is cyclically connected directly to the circuit element and the reference capacitor by the switching circuit so as to receive said currents of the circuit element and the reference capacitor, feedback circuit means for maintaining the charge stored by said reservoir capacitor circuit substantially constant so that the current supplied by the feedback circuit means to the reservoir capacitor circuit balances the said currents of the circuit element and the reference capacitor, and means for monitoring the operation of the feedback circuit means to provide said measurement.

2. A circuit according to claim 1, wherein the switching circuit comprises two solid state switches controlled by the output of an oscillator.

3. A circuit according to claim 2, wherein one switch is connected in series with the circuit element across the common voltage source, and the other switch is arranged in series with the reference capacitor across the common voltage source, comprising means to control the switches to simultaneously charge up their respective capacitors from the common voltage source, and then to discharge them into respective reservoir capacitors of the reservoir capacitor circuit, the capacitances of the reservoir capacitors being larger than the capacitances of the circuit element and the reference capacitor, and the monitoring means being arranged to compare the discharge currents by comparing feedback currents supplied to the reservoir capacitors by respective feedback circuits of the feedback circuit means operating to maintain the voltage across each of the reservoir capacitors constant.

4. A circuit according to claim 2, wherein the two switches are arranged in series across the common voltage source, comprising means to control the switches to firstly connect either one of the circuit element and reference capacitor across the common voltage source and the other of the circuit element and reference capacitor across a common reservoir capacitor of the reservoir capacitor circuit, and secondly to connect said one of the circuit element and reference capacitor across the reservoir capacitor and to fully discharge the said other of the circuit element and reference capacitor, the feedback circuit means being supplied from the common voltage source and arranged to maintain the voltage across the common reservoir capacitor at a fixed voltage proportional to the common voltage source, and the monitoring means being arranged to compare the discharge currents by monitoring the feedback current necessary to maintain the voltage across the common reservoir capacitor constant.

5. A circuit according to claim 1, wherein the switching frequency of the switching circuit is such that the circuit element and the reference capacitor are fully charged and then fully discharged in the course of each switching cycle.

6. A circuit according to claim 1, comprising means for measuring the peak charging voltage in the circuit element and the reference capacitor, means for comparing the measured peak charging voltages with a fixed reference voltage, and means for controlling the voltages supplied to the switching circuit to maintain the peak charging voltages constant regardless of the resistance of the switching circuit.

7. A circuit according to claim 2 comprising a CMOS bilateral switch arranged such that both said switches are on the same silicon chip, the oscillator and its associated circuits being such that both said switches break before make.

8. A method for measuring the capacitance of a circuit element, wherein the circuit element and a reference capacitor are alternately charged and discharged at the same frequency from a common voltage source, the charging of the circuit element being synchronized with either the charging or the discharging of the reference capacitor, and currents of the circuit element and the reference capacitor are compared to provide a measure of the difference between the capacitances of the circuit element and the reference capacitor, wherein the circuit element and the reference capacitor are cyclically connected directly to a reservoir capacitor circuit so that said currents are received by the reservoir capacitor circuit, the charge stored by said reservoir capacitor circuit is maintained substantially constant by a feedback circuit means so that the current supplied by the feedback circuit means to the reservoir capacitor circuit balances the said currents of the circuit element and the reference capacitor, and the operation of the feedback circuit means is monitored to provide said measurement.

* * * * *